(12) United States Patent
Gai et al.

(10) Patent No.: US 7,295,605 B2
(45) Date of Patent: Nov. 13, 2007

(54) ADAPTIVE EQUALIZER WITH DC OFFSET COMPENSATION

(75) Inventors: Weixin Gai, San Jose, CA (US); Yasuo Hidaka, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 701 days.

(21) Appl. No.: 10/783,170

(22) Filed: Feb. 20, 2004

(65) Prior Publication Data

US 2005/0185710 A1 Aug. 25, 2005

(51) Int. Cl.
*H03K 5/159* (2006.01)

(52) U.S. Cl. ............... 375/232; 375/229; 375/231

(58) Field of Classification Search ............ 375/231, 375/232, 262, 265, 229
See application file for complete search history.

(56) References Cited

U.S. PATENT DOCUMENTS

| | | | |
|---|---|---|---|
| 6,301,298 B1 * | 10/2001 | Kuntz et al. | 375/232 |
| 6,449,320 B1 * | 9/2002 | Lindoff | 375/319 |
| 6,563,868 B1 * | 5/2003 | Zhang et al. | 375/232 |
| 6,756,924 B2 * | 6/2004 | Lee et al. | 341/120 |
| 7,092,676 B2 * | 8/2006 | Abdelgany et al. | 455/76 |

FOREIGN PATENT DOCUMENTS

KR 0154782 11/1998

OTHER PUBLICATIONS

Notice Requesting Submission of Opinion, (translation) from office communication from Lee International Attorneys, Seoul, Korea (2 pages), Sep. 29, 2006.

* cited by examiner

*Primary Examiner*—Chieh M. Fan
*Assistant Examiner*—Julia P Tu
(74) *Attorney, Agent, or Firm*—Baker Botts L.L.P.

(57) ABSTRACT

A method for compensating for attenuation in an input signal includes receiving an input signal, communicating a first portion of the input signal on a first path, communicating a second portion of the input signal on a second path, and communicating a third portion of the input signal on a third path. The method also includes applying a first gain to the first portion of the input signal, applying a first-order mathematical operation and a second gain to the second portion of the input signal, and applying a second-order mathematical operation and a third gain to the portion of the input signal. The method further includes recombining the first portion, the second portion, and the third portion into an output signal.

22 Claims, 4 Drawing Sheets

ADAPTIVE EQUALIZER WITH DC OFFSET COMPENSATION

RELATED APPLICATIONS

This application is related to co-pending U.S. patent application Ser. No. 10/783,070, entitled "Adaptive Equalizer with DC Offset Compensation," filed Feb. 20, 2004.

TECHNICAL FIELD OF THE INVENTION

This invention relates generally to signal communication, and more particularly, to an adaptive equalizer with DC offset compensation.

BACKGROUND OF THE INVENTION

When signals are communicated over communication media, the signals may suffer attenuation from phenomena such as skin effect and dielectric absorption. Signal receivers may include equalizers that compensate for this attenuation in order to improve the accuracy and efficiency of signal communication. It is desirable for the amount of compensation applied by equalizers to match the level of attenuation due to the media as closely as possible, in order to keep the output characteristics of the signal consistent independent of the particular communication path used to communicate the signal.

SUMMARY OF THE INVENTION

In one embodiment of the present invention, a method for compensating for attenuation in an input signal includes receiving an input signal, communicating a first portion of the input signal on a first path, communicating a second portion of the input signal on a second path, and communicating a third portion of the input signal on a third path. The method also includes applying a first gain to the first portion of the input signal, applying a first-order mathematical operation and a second gain to the second portion of the input signal, and applying a second-order mathematical operation and a third gain to the portion of the input signal. The method further includes recombining the first portion, the second portion, and the third portion into an output signal.

One technical advantage of certain embodiments is equalizing output signals. Certain embodiments compensate for signal attenuation resulting from the communication media used to communicate the signal. This allows the output characteristics of the signal to remain consistent independent of the communication path used to communicate the signal. Advantages associated with consistent output characteristics may include improved component response, as the signal level can be selected to fall within the dynamic range of system components. Furthermore, the signal can be kept at a sufficient level to prevent information from being lost.

Other technical advantages of certain embodiments include adaptability to different communication media. Certain embodiments use variable gain amplifiers to adjust the degree of compensation applied to an incoming signal. Such embodiments may allow the amount of compensation to be adjusted for different media, thus increasing the versatility of equalizers embodying such techniques. Furthermore, such embodiments may also adapt to changes in media characteristics associated with process, voltage, and temperature variations.

Still another technical advantage of certain embodiments is facilitating high speed response. Certain embodiments use multiple stage variable gain amplifiers for signal amplification with DC offset correction at each stage. Because each amplifier applies only a portion of the total amplification, the overall response time of the multi-stage amplifier is reduced. Applying DC offset correction at each stage may increase the flexibility of such a multi-state amplifier by preventing the signal from exiting the dynamic range of any particular stage of the amplifier.

Yet another technical advantage of certain embodiments is scalability of multi-stage amplifiers. By correcting for DC offset at each stage of a multi-stage amplifier, additional stages can be added without a recalculation of the overall DC offset of the multi-stage amplifier. Furthermore, the risk that using a large-magnitude DC offset to correct for the DC offset of the entire multi-stage amplifier will take the signal out of the dynamic range of one of the amplifier stages is substantially reduced. These and other aspects may help enable applications such as high speed communication.

Other technical advantages will be readily apparent to one skilled in the art from the attached figures, description, and claims. Moreover, while specific advantages have been enumerated above, particular embodiments may include some, all, or none of the enumerated advantages.

DETAILED DESCRIPTION OF THE INVENTION

Figure 1:
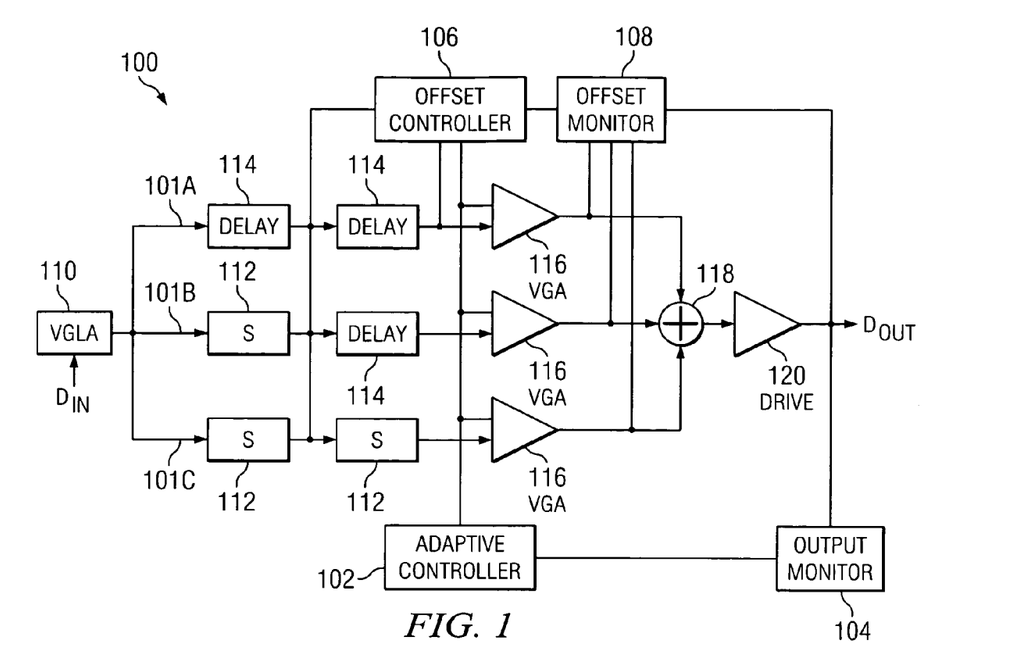
FIG. 1 illustrates one embodiment of an equalizer used to compensate for signal attenuation in communication media.

FIG. 1 illustrates an equalizer 100 that compensates for attenuation in a signal communicated to equalizer 100 using a communication medium. In the depicted embodiment, equalizer 100 includes an adaptive controller 102 that adjusts the amount of gain applied to each of three signal paths 101A, 101B, and 101C based on an output characteristic of the output signal measured by an output monitor 104. Equalizer 100 also includes an offset controller 106 that corrects for DC offsets imparted by components of equalizer 100 in response to offset monitor 108 detecting an improper DC offset in the output signal of equalizer 100. Other components of equalizer 100 include variable gain limiting amplifier 110 mathematical operators S 112, delay generators 114, variable gain amplifiers 116, mixer 118, and drive amplifier 120. In general, equalizer 100 provides an equalized output signal with a corrected DC offset despite distortions in the input signal due to attenuation in communication media and variations in the DC offset of the signal potentially caused by fabrication technology, such as device geometry mismatch or threshold voltage mismatch.

Generally, there are two significant causes for signal attenuation in conductive communication media. The first significant cause is skin effect from conduction of the signal along the communication medium. The second significant cause is dielectric absorption of the signal by the communication medium. In general, the amount of signal loss in decibels due to skin effect is proportional to the product $a_s \cdot x \cdot \sqrt{f}$, where $a_s$ is the coefficient of skin effect for the material, x is the length traveled along the material, and f is the frequency of the signal. The amount of loss due to dielectric absorption is proportional to the product $a_d \cdot x \cdot f$, where $a_d$ is the coefficient of dielectric absorption of the material. The relative significance of the effects can vary widely depending on the material and the frequency of the signal. Thus, for example, cables may have a coefficient of dielectric absorption that is much smaller than the coefficient of skin effect, so that loss due to skin effect dominates except at high frequencies. On the other hand, backplane traces may have higher coefficients of dielectric absorption, so that the loss due to dielectric absorption is comparable to or greater than the amount of loss due to skin effect. Furthermore, the characteristics of materials with changes in operating conditions, such as process, voltage, or temperature (PVT) variations, may effect the response of equalizer 100 to input signals.

In order to compensate for these losses, equalizer 100 divides the signal among three signal paths 101A, 101B, and 101C, and selectively amplifies the portion of the signal on each path using variable gain amplifiers 116. The first path 101A represents the unmodified input signal. The second path 101B applies a first-order mathematical operation based on the frequency of the signal to the signal, such as a derivative operation. This operation is illustrated as mathematical operator S 112. The third path 101C applies a second-order mathematical based on the frequency of the signal to the signal, such as a second derivative. This operation is illustrated by the application of two mathematical operators S 112. By selectively amplifying the first- and second-order components of the signal, equalizer 100 compensates for loss effects that are proportional to the frequency and to the square root of the frequency, respectively. With that general background as to the operation of equalizer 100, it is appropriate to discuss in detail the components of equalizer 100.

Adaptive controller 102 represents any component or components for analyzing information about the output signal of equalizer 100 and for adjusting the respective gain of each of the variable gain amplifiers 116. Adaptive controller 102 may include analog and/or digital electronic components, such as transistors, resistors, amplifiers, constant current sources, or other similar components. Adaptive controller 102 may also include suitable components for converting signals from analog signals to digital signals or vice versa. According to a particular embodiment, adaptive controller 102 includes a digital processor, such as a microprocessor, microcontroller, embedded logic, or other information-processing component. Also according to a particular embodiment, adaptive controller 102 controls the gain of each of the variable gain amplifiers 116 by adjusting the bias current applied to each variable gain amplifier 116. One advantage of using bias currents to control amplifiers 116 is that it adjusts the amount of gain applied by the amplifier without changing the bandwidth of the amplifier, so that the amplifier can maintain its dynamic range even when the gain is increased.

Output monitor 104 represents any component for detecting an output characteristic of the output signal of equalizer 100. Output monitor 104 may include any sensors, integrators, amplifiers, comparators, or other suitable components for performing signal detection and analysis using any suitable operation, including signal averaging, filtering, or latching maximum or minimum levels. According to a particular embodiment, output monitor 104 detects an inter-symbol-interference level for the output signal, which is indicative of the amount of distortion in a signal caused by skin effect and/or dielectric absorption. Also according to a particular embodiment, output monitor 104 communicates the output characteristic as an analog signal to adaptive controller 102.

Offset controller 106 represents any component or components for adjusting the amount of DC offset correction applied at one or more stages of variable gain amplifier 116. Offset controller 106 may include any microprocessors, microcontrollers, embedded logic, or other suitable components for analyzing information received from offset monitor 108 and adjusting the amount of correction voltage applied to a signal to correct a DC offset. DC offset may be imparted to the signal by various components of equalizer 100, an in particular, by variable gain amplifiers 116. In multi-stage variable gain amplifiers, the DC offset may be cumulative between stages. Offset controller 106 applies a DC voltage to the signal being amplified by variable gain amplifier 116 to correct the offset. According to a particular embodiment, offset controller 106 applies the correction voltage in steps, wherein each step is applied at a different stage of variable gain amplifier 116. In such an embodiment, the amount of voltage applied at each step may be determined in any suitable manner. For example, the total correction voltage may be divided evenly between the steps, or it may be distributed in an amount proportional to the gain of the respective stages.

Offset monitor 108 represents any suitable component or components for measuring the amount of DC offset in a signal. Offset monitor 108 may include low pass filters, integrators, amplifiers, comparators, or other suitable components for detecting a DC offset. In the depicted embodiment, offset monitor 108 is coupled to the output of equalizer 100 as well as the output of each of the variable gain amplifiers 116. Thus, offset monitor 108 can measure the overall DC offset imparted by equalizer 100 as well as the DC offset imparted by each of the variable gain amplifiers 116. This permits offset controller 106 to make suitable DC offset adjustments both to a particular path 101A, 101B, or 101C and to the overall output of equalizer 100.

Variable gain limiting amplifier (VGLA) 110 represents a component or collection of components for conditioning input signals received by equalizer 100. The conditioning process adjusts the overall level of the input signal to keep the signal within the dynamic range of equalizer 100. Thus, VGLA 110 may provide some degree of equalization by adjusting the overall signal of the level. In a particular embodiment, the amount of amplification applied by VGLA 110 is controlled by a bias current applied to VGLA 110.

Mathematical operator S 112 represents any component or collection of components that produces an output that is linearly proportional to the frequency of the incoming signal, referred to as a "first-order operation." Mathematical operator S 112 may include any suitable electronic components or circuitry for performing the desired mathematical operation. According to a particular embodiment, the operation is a derivative operation, which multiplies an incoming sinusoidal signal by a multiple of the frequency of the signal. Mathematical operator S 112 may be applied to a signal multiple times, resulting in an output signal that is proportional to the square, cube, or other exponential power of the frequency based on the number of times S 112 is applied.

Delay generator 114 represents any component or collection of components that introduces a time delay in the communication of a signal. Delay generator 114 may include any suitable electronic components or circuitry. According to a particular embodiment, the delay introduced to a signal by delay generator 114 is approximately equal to the amount of time required for mathematical operator S 112 to be applied to a signal. Thus, delay generators 114 may be used to equalize the amount of time required for each portion of the input signal to travel down the corresponding path 101A, 101B, or 101C. In this way, the respective portions of the signals may be synchronized when they arrive at mixer 118.

Variable gain amplifiers 116 represent any component or components for amplifying a signal. Variable gain amplifiers 116 may include any suitable electronic components, and in a particular embodiment, each variable gain amplifier 116 is controlled by a bias current applied to the particular variable gain amplifier 116. In some cases, the response time of particular components performing the amplification may be too high, so that the amplifier cannot effectively amplify high-frequency signals that change rapidly between high and low values. Accordingly, variable gain amplifier 116 may include a series of stages, each of which performs part of the overall amplifications. Because no stage has the burden of performing all of the amplification, the time required for each stage to apply its respective gain is also less. This allows the multi-stage variable gain amplifier 116 to respond to higher frequency signals.

Variable gain amplifiers 116 may also impart a DC offset to the signal. In multi-stage amplifiers, each stage may impart a DC offset. One method of correcting the DC offset is to apply a correction voltage to correct the DC offset in the signal. The correction voltage may be applied entirely to the initial signal before it is amplified. However, applying the voltage entirely at one point may take the signal out of the dynamic range of one or more stages of amplifier 116. Furthermore, the voltage applied is recalculated and adjusted every time a new stage is added, and if the gain is variable in each stage, the DC offset may be unevenly distributed among the stages. In order to deal with this difficulty, particular embodiments may include applying a correction voltage at multiple stages of amplifier 116. This allows the DC offset for each stage to be corrected at that stage, reducing the chance that a correction will take the signal out of the dynamic range of the amplifier and removing the need to recalculate the DC offset for the entire array each time a stage is added. Furthermore, applying the correction voltage at each stage facilitates correcting the DC offset when the gain of each stage is independently variable, so that different stages may have different gains and may impart different DC offsets.

Mixer 118 represents a component or collection of components for recombining the signals on communications paths 101A, 101B, and 101C into a single signal. Mixer 118 may include any suitable electronic components. Mixer 118 provides the combined signal to drive amplifier 120. Drive amplifier 120 represents any component or collection of components for amplifying the combined signal. Driver amplifier 120 performs any suitable amplification on the combined signal to produce an output signal for equalizer 100 that has a sufficiently high signal level to allow effective communication of the output signal to another destination.

In operation, equalizer 100 receives an input signal that has been attenuated by communication through a communication medium. VGLA 110 conditions the signal so that the signal level is within the dynamic range of equalizer 100. Equalizer 100 divides the input signal among three paths 101A, 101B, and 101C. The signal in path 101A is delayed twice by delay generators 114. The signal on path 101B is subject to mathematical operator S 112 once and delayed once by delay generator 114. The signal on path 101C is subject to mathematical operator S twice 112. Thus, the three paths 101A, 101B, and 101C correspond to the input signal subject to no operation, a first-order operation, and a second-order operation, respectively.

Equalizer 100 then amplifies the signal on each path using the respective variable gain amplifier 116. The gain of each amplifier 116 is controlled by adaptive controller 102, and the gain may be different for each path 101A, 101B, and 101C. This allows equalizer 100 to provide different degrees of compensation for loss effects that have different proportionality relationships with the frequency of the signal. In general, the amount of compensation for a particular effect relative to the base signal is proportional to the ratio of the amplification of the corresponding path to the amplification of the unmodified signal on path 101A. Accordingly, path 10A may apply no gain or a slightly negative gain (in dB) in order to increase the relative effect of the compensation applied to other paths. Offset controller 106 corrects any DC offset imparted to the respective signals on each path 10A, 10B, and 101C by the corresponding amplifier 116.

The amplified signals from each path are combined into a single signal by mixer 118. Drive amplifier 120 amplifies this output signal to allow effective communication of the output signal to another destination. Output monitor 104 and offset monitor 108 monitor the characteristics of the output signal and provide feedback to adaptive controller 102 and offset controller 106. Adaptive controller 102 uses the feedback from output monitor 104 about the level of the output signal to determine whether adaptive controller 102 is overcompensating or undercompensating for attenuation in the input signal. Based on that determination, adaptive controller 102 may suitably adjust the amount of gain applied to one or more paths 10A, 101B, and 101C to more effectively compensate. Offset controller 106 uses information about the DC offset of the output signal provided by offset monitor 108 to adjust the amount of correction voltage applied at each of the amplifiers 116.

One advantage of the adaptive control and feedback described above is that equalizer 100 can respond to effects that change the response of equalizer 100 to signals, such as process, voltage, and temperature (PVT) variations. The adaptive response allows equalizer 100 to produce consistent output characteristics of the output signal even as the attenuation varies. Even embodiments that do not include automatic adaptive control may be adjusted manually in response to changed conditions or detected variations in response.

An advantage of particular embodiments of equalizer 100 is adaptability to other communication media. For example, equalizer 100 may be coupled to a cable, with the gain setting appropriately set to compensate for the attenuation due to skin effect and dielectric absorption. If equalizer 100 is then coupled to a backplane trace in place of the cable, the gain of paths 101A, 101B, and 101C may be adjusted using controller 102 in order to permit equalizer 100 to compensate for the different attenuation properties of the backplane trace. This provides advantages over previous methods of compensation in which equalizing circuits were constructed to provide an inverse operation of the transfer function for a particular communication medium, so that the circuits could not be applied effectively to communication media having different transmission characteristic.

Although particular embodiments of equalizer 100 have been described in detail, there are numerous other possible embodiments. Possible variations include, for example, applying different or additional mathematical operations to paths 101A, 10B, and 101C in order to compensate for different loss properties, increasing the number of paths, using manual control for controllers 102 and 106 rather than automatic feedback control, using single-stage amplifiers 116, and other variations suggested by the description above. In general, components may be rearranged, modified or omitted in any suitable manner, and the functions performed by components may be distributed among different or additional components or consolidated within single components in any suitable way. Accordingly, it should be understood that implementations of equalizer 100 may include any such variations.

Figure 2:
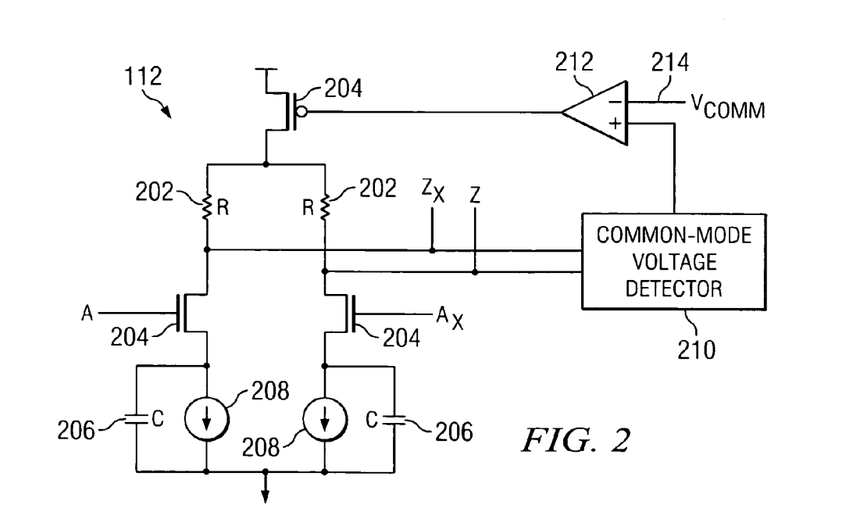
FIG. 2 illustrates one embodiment of a circuit used to apply a first-order mathematical operation to a signal.

FIG. 2 illustrates a particular embodiment of mathematical operator S 112. In the depicted embodiment, S 112 applies the derivative operation to an input signal, provided as a differential input A (with complement $A_x$) to operator S 112. Operator S 112 includes resistors 202, transistors 204, capacitors 206, and constant current sources 208. Transistors 204 may be any suitable transistor, including, for example, the metal oxide semiconductor field effect transistors (MOSFETs) depicted in FIG. 2. The component values of resistors 202, capacitors 206, and constant current sources 208 may be selected to produce a desired proportionality factor between the frequency of the input signal and the level of the output signal.

S 112 also includes a common-mode voltage detector (CMVD) 210, which monitors the common mode voltage of differential output signal Z (with complement $Z_x$). CMVD 210 is coupled to amplifier 212, which compares the output of CMVD 210 to a reference common voltage ($V_{comm}$) 214. In conjunction, CMVD 210 and amplifier 212 maintain the common mode voltage of the differential output signal Z at $V_{comm}$ 214. This prevents voltage drift in the output signal that might otherwise occur.

In operation, S 112 receives input signal A. The response of operator S 112 to input signal A is frequency dependent because of the frequency-dependent response of capacitors 206. Resistors 202 and constant current sources 208 regulate the rate at which capacitors 206 are charged and discharged by input signal A. Thus, S 112 provides an output signal Z proportional to the frequency of input signal A. CMVD 210 monitors the common mode voltage of output signal Z, and amplifier 212 corrects the common mode voltage as necessary.

The described operator S 112 is only one particular example of one particular first-order mathematical operation. Other operations may be used in equalizer 100, and other suitable components may be used to produce the described derivative operation. Furthermore, other mathematical operations could produce higher-order responses, such as output signals proportional to the square of the frequency. It should be understood that such variations are contemplated as within the scope of the present disclosure.

Figure 3:
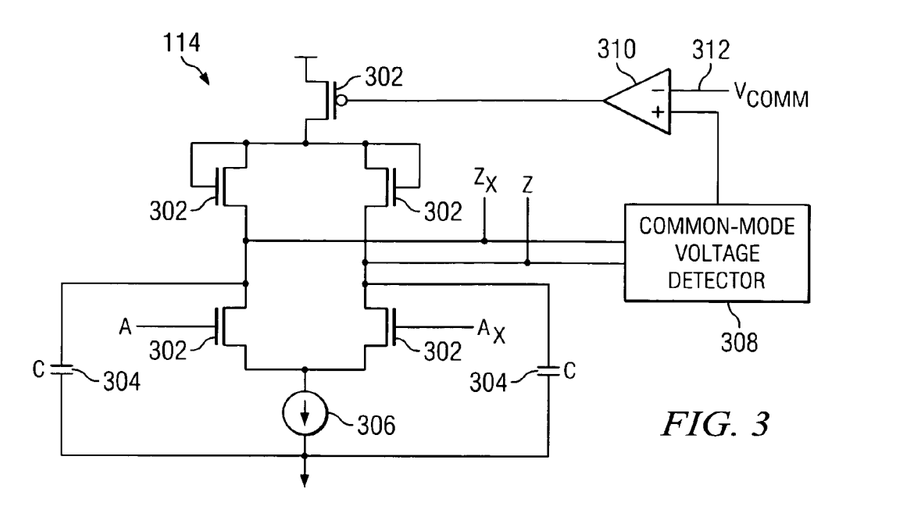
FIG. 3 illustrates one embodiment of a circuit for introducing a delay into a signal.

FIG. 3 illustrates one embodiment of delay generator 114. Delay generator 114 produces a differential output signal Z that is phase-lagged behind a differential input signal A. In the depicted embodiment, delay generator 114 includes transistors 302, capacitors 304, constant current source 306, CMVD 308, and amplifier 310. Transistors 302 may be any suitable transistor, including, for example, the metal oxide semiconductor field effect transistors (MOSFETs) depicted in FIG. 3. The component values of capacitors 304 and constant current source 306 may be selected to contribute a suitable phase lag between the input signal A and the output signal Z. According to a particular embodiment, component values of delay generator 114 are selected to match the phase lag of delay generator 114 to the time required for S 112 to apply its respective mathematical operation.

In operation, delay generator 114 produces an output signal Z that is lagged behind input signal A because of the charging time of capacitor 304 and the response time of transistors 302. CMVD 308 and amplifier 312 work in conjunction to maintain the common mode voltage of output signal Z at $V_{comm}$ 312. This helps to prevent voltage drift in the output signal that might otherwise occur.

The depicted embodiment of delay generator 114 is only one example of numerous possible components for imparting a delay to an input signal. In other embodiments, the amount of delay may be adjustable, such as by using variable capacitors 304 or a variable constant current source 306. Other components may be used to generate the desired delay, and various depicted components may be rearranged or omitted. It should be understood that such variations are contemplated as within the scope of the present disclosure.

Figure 4:
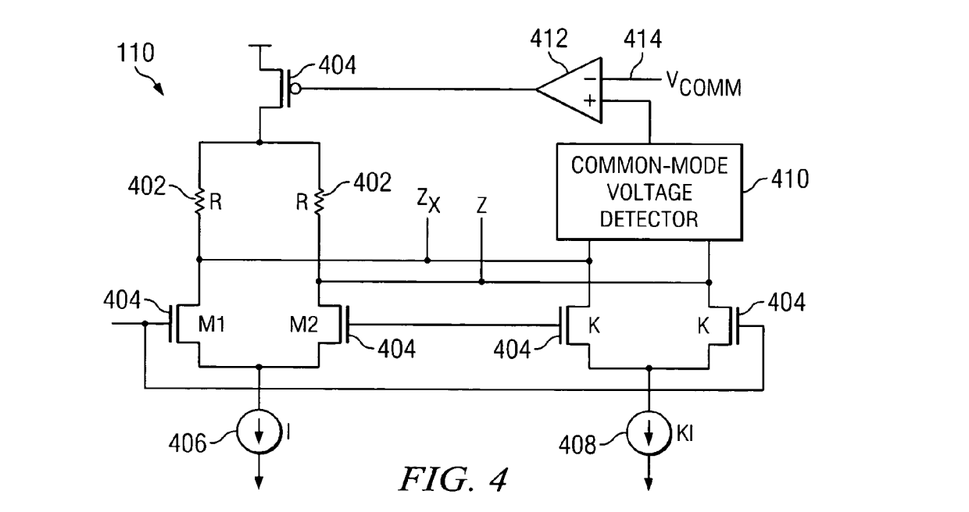
FIG. 4 illustrates one embodiment of a variable gain limiting amplifier used to keep a signal within the dynamic range of an equalizer.

FIG. 4 illustrates one embodiment of VGLA 110. In the depicted embodiment, VGLA 110 includes resistors 402, transistors 404, constant current source 406, variable constant current source 408, CMVD 410, and amplifier 412. Transistors 404 may be any suitable transistor, including, for example, the metal oxide semiconductor field effect transistors (MOSFETs) depicted in FIG. 4. The component values of resistors 402 and constant current source 406 may be suitable selected to create a desired amplification range for VGLA 110. Variable constant current source 408 is adjustable to control the amount of current biasing transistors 404 (labeled "k"), allowing the gain of VGLA 110 to be controlled.

In operation, VGLA 110 applies a gain in an input signal applied to input transistors 404 (labeled as "M1" and "M2"). The amount of gain is controlled by variable current source 408, as well as the component values of the other components of VGLA 110. VGLA 110 also limits the maximum level of signal in order to prevent the signal from moving out of the dynamic range of equalizer 100. CMVD 410 monitors the common mode voltage of the output signal Z, and in conjunction with amplifier 412, maintains the common mode voltage of the output signal Z at $V_{comm}$ 414.

The depicted embodiment is only one of numerous possible embodiments of VGLA 110. Other components may be used to generate the desired variable gain, limit the maximum level of the output signal, and otherwise condition the input signal to equalizer 100. Furthermore, various depicted components may be rearranged or omitted. It should be understood that such variations are contemplated as within the scope of the present disclosure.

Figure 5:
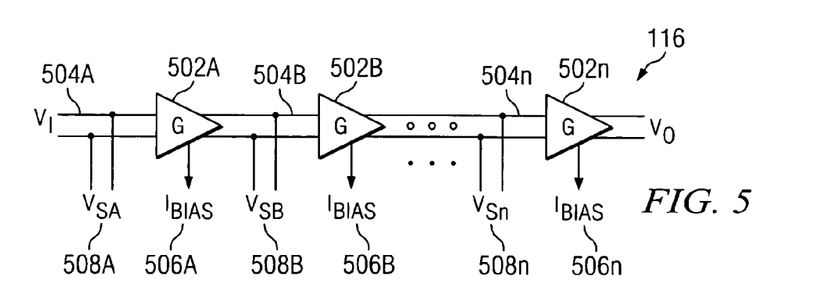
FIG. 5 illustrates one embodiment of a multi-stage variable gain amplifier with DC offset correction.

FIG. 5 illustrates one example of a multi-stage embodiment of variable gain amplifier 116. In the depicted embodiment, amplifier 116 includes amplifier stages 502A, 502B, . . . 502n (collectively referred to as "stages 502"). Each amplifier applies a variable gain g to an signal applied to its corresponding input terminal 504A, 504B, . . . 504n (collectively referred to as "input terminals 504"). The gain produced by each stage 502 may be independently variable, or alternatively, may be automatically equalized among all stages. According to a particular embodiment, the gain may be controlled by adjusting a bias current 506A, 506B, . . . 506n (collectively referred to as "bias currents 506") applied to the corresponding stage 502. Controlling stages 502 using bias currents 506 may increase the gain of stages 502 without significantly decreasing the bandwidth of stages 502.

Each stage 502 may impart a DC offset to signals applied to the stage's respective input terminal 504. The amount of DC offset thus imparted may vary depending on the gain of a particular stage 502, and generally, different stages 502 may impart different DC offsets 502. Previous methods have corrected the DC offset by applying a correction voltage before the first stage 502A to account for the DC offset imparted by the entire multi-stage amplifier 116. However, this may move the signal outside of the dynamic range of one or more stages 502, particularly when the amount of DC offset imparted varies from stage 502 to stage 502. Furthermore, there is the risk than any uncorrected DC offset will be amplified in each subsequent stage 502, thus potentially disrupting the signal.

Accordingly, in the depicted embodiment, a correction voltage $V_s$ 508 (collectively referring to voltages $V_{sA}$ 508A, $V_{sB}$ 508B, . . . $V_{sn}$ 508n) is applied at input terminal 504 of each stage 502. This reduces the risk that an uncorrected DC offset at the beginning will be amplified to the point of seriously impairing signal quality as well as reducing the risk the signal will be moved out of the dynamic range of one of the stages 502. The amount of correction voltage 508 applied at each stage 502 may be tailored for the particular stage 502, so that the risk of the signal moving out of the dynamic range of any stage 502 is further reduced. A new correction voltage 508 may be added for each new stage 502. This prevents the risk of moving the signal out of the dynamic range of stages 502 from rising with the addition of each new stage 502, as it would in the case of a single DC offset applied at first stage 502A.

The amount of correction voltage 508 applied to each stage 502 may be varied in a number of ways. Correction voltage 508 may be divided evenly among stages 502 so that the overall correction equals the overall DC offset imparted by amplifier 116. Alternatively, correction voltage 508 may be selectively adjusted on a stage-by-stage basis. For example, the amount of correction voltage 508 could be adjusted whenever the gain of a stage is changed. In such embodiments, it may be useful for offset controller 106 and adaptive controller 102 to be in communication with one another to facilitate rapid adjustments. Correction voltages 508 may be adjusted automatically in response to information received from offset monitor 108. Alternatively, correction voltages 508 may be adjusted manually. These and other numerous variations involving adding, omitting, or rearranging various components should be understood to be within the scope of the description provided. In particular, it should be understood that the described techniques may be applied in any multi-stage variable gain amplifier, not limited to the amplifiers used in equalizers 100 or similar devices.

Figure 6:
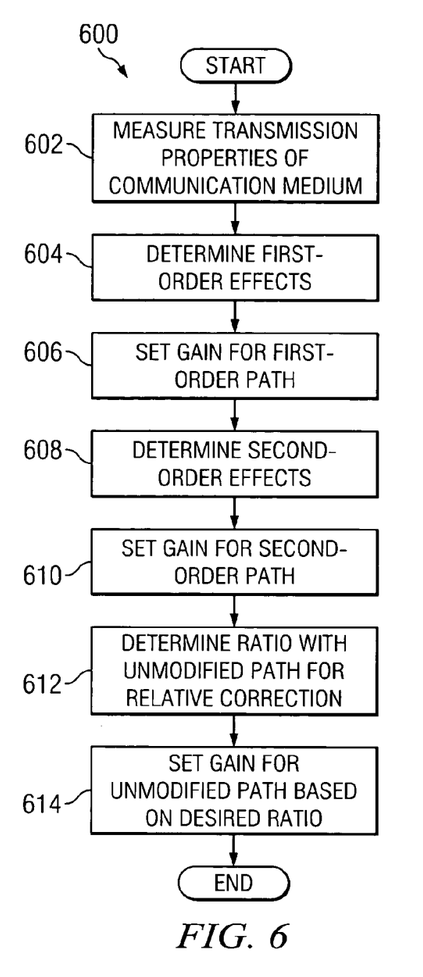
FIG. 6 illustrates one embodiment of a method for setting the gain along signal paths in the circuit of FIG. 1.

FIG. 6 is a flow chart 600 illustrating an example method for setting the gain levels for paths 101A, 101B, and 101C using controller 102. At step 602, transmission properties for a communication medium are measured. This measurement may be used to determine physical properties of the communication medium, such as skin effect coefficient, dielectric absorption coefficient, length, or other properties relevant to attenuation of signals. Effects with a first-order frequency dependence for the medium are determined at step 604. This may include any type of attenuation that is linearly proportional to the frequency of a signal carried in the medium. Based on the first-order effect, controller 102 is set to produce a gain on path 101B that will compensate appropriately for the first-order effects at step 606. Effects with a second-order frequency dependence are determined from the measurements performed on the medium at step 608, and controller 102 is set to produce a compensating gain on path 101C at step 610.

In order to verify that the relative compensation on first-order path 101B and second-order path 101C is sufficient relative to unmodified path 101A, the ratio of amplification between paths is calculated at step 612. Based on this ratio, it can be determined whether the amount of compensation applied to paths 101B and 101C will be sufficient relative to the unmodified signal. If the amount of compensation is not sufficient, a negative dB gain may be applied to the unmodified path 101A in order to improve the gain/gain ratio of the paths at step 614. For example, full compensation for attenuation effects in a particular case could require a gain of 1 on path 101A, a gain of 10 on path 101B, and a gain of 50 on path 101C. If amplifier 116 on path 101C has a maximum gain of 40, then a gain of, for example, 0.8 may be applied to path 101A, so that the ration between paths may be maintained by setting the gains of paths 101B and 101C to 8 and 40, respectively. Once all of the gains are set, the method is at an end.

Figure 7:
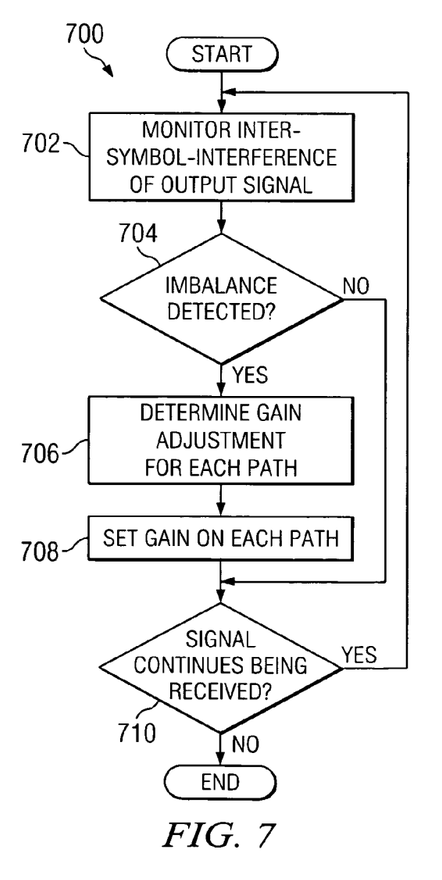
FIG. 7 illustrates one embodiment of a method for adaptively adjusting the gain along signal paths in the circuit of FIG. 1.

FIG. 7 is a flow chart 700 illustrating a method for adaptively adjusting the gain of paths 101A, 101B, and 101C. Equalizer 100 begins processing input signals to generate output signals, and the adaptive control method begins. Output monitor 104 monitors inter-symbol-interference in the output signal at step 702 in order to determine whether there is an imbalance in the signal indicating that the gain of one or more paths 101A, 101B, and 101C needs to be adjusted. If an imbalance is detected at decision step 704, then adaptive controller 102 determines a gain adjustment for each path at step 706, based upon the information provided by output monitor 104. Adaptive controller 102 then adjusts the gain of each path 101A, 101B, and 10C, as appropriate, at step 708. The method may be repeated as long as a signal is continuing to be received, as shown by decision step 710.

The methods of operation described in FIGS. 6 and 7 are only examples of methods for setting the appropriate gain of variable gain amplifiers 116 in equalizer 100. In other embodiments, the described steps may be performed in any suitable order, and particular steps may be omitted and added. Moreover, other methods of setting the gain may also be used, which particularly includes any method of operation that is consistent with any of the numerous embodiments of equalizer 100 described above.

Figure 8:
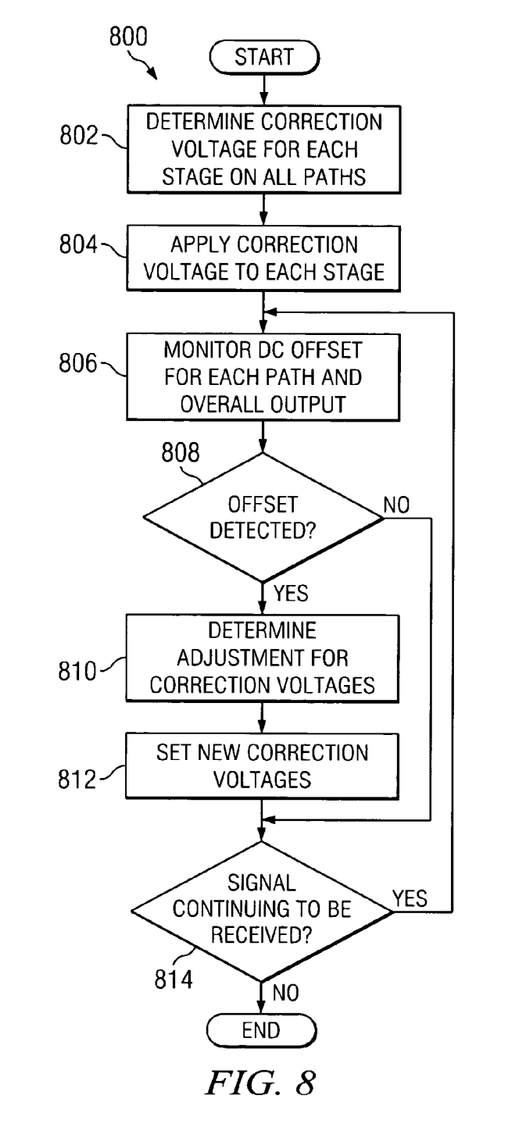
FIG. 8 illustrates one embodiment of a method for adaptively controlling a correction voltage for DC offsets in a multi-stage variable gain amplifier.

FIG. 8 is a flow chart 800 illustrating one embodiment of a method for adaptively controlling a correction voltage applied to correct DC offsets in a multi-stage amplifier 116. In the depicted method, a correction voltage is determined for each stage 502 along all paths 101A, 101B, and 101C at step 802. This determination may be based upon any suitable measurement of the DC offset imparted by particular stages

502. Offset controller 106 applies the respective correction voltage to each stage at step 804.

When equalizer 100 is activated and receiving signals, offset monitor 108 monitors the DC offset of each path 101A, 101B, and 101C as well as the DC offset of the overall output signal at step 806. If an unexpected offset is detected at decision step 808, then offset controller 106 determines an appropriate adjustment for the correction voltage at step 810. Offset controller 106 then applies the adjustment at step 812. Then, as shown in decision step 814, the method may be repeated from step 806 as long as a signal continues.

Figure 9:
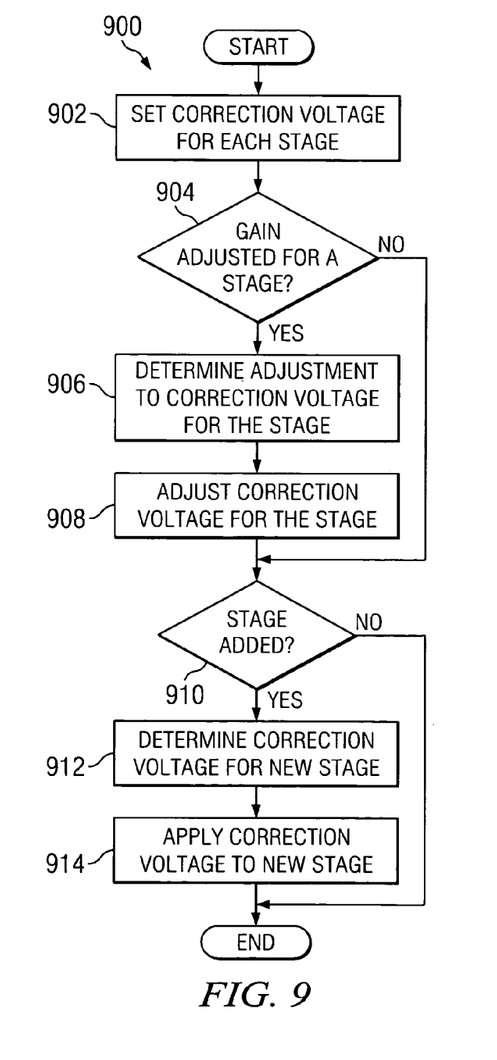
FIG. 9 illustrates one embodiment of a method for adjusting correction voltages in a multi-stage variable gain amplifier.

FIG. 9 illustrates a method for adjusting correction voltages in a multi-stage amplifier 116. The method begins at step 902 with setting correction voltages for each stage 502, such as by applying steps 802 and 804 of the method depicted in FIG. 8. One the correction voltages are set, they may be adjusted based on changes in multi-stage amplifier 116. If the gain of one or more stages 502 is adjusted, as shown in decision step 904, then offset controller 106 may determined a new correction voltage for each such stage 502 at step 906. Offset controller 106 then applies the new correction voltage at step 908.

Offset controller 106 may also be adjusted in response to the addition of a stage 502 to multi-stage amplifier 116. If a stage is added at decision step 910, then a correction voltage for the new stage 502 is determined at step 912. Offset controller 106 applies the correction voltage to the new stage 502 at step 914. Because the correction voltages are applied to each stage separately, there is no need to make adjustments in the correction voltages associated with any other stages 502. After the suitable adjustments for gain changes or additional stages are made, the method is at an end.

The methods of operation depicted in FIGS. 8 and 9 are only examples of numerous possible methods for applying correction voltages to multiple stages of a multi-stage amplifier 116. Other embodiments may include, for example, applying correction voltages at every other stage 502 rather than every stage 502, controlling offsets manually rather than through feedback, or other similar variations. In particular, any method of operation consistent with any of the embodiments of variable gain amplifier 116 described above should be understood to be within the scope of the present disclosure.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for compensating for attenuation in an input signal, comprising:
   receiving an input signal;
   communicating a first portion of the input signal on a first path;
   communicating a second portion of the input signal on a second path;
   communicating a third portion of the input signal on a third path;
   applying a first gain to the first portion of the input signal to generate a first processed signal;
   applying a first-order mathematical operation and a second gain to the second portion of the input signal to generate a second processed signal;
   applying a second-order mathematical operation and a third gain to the third portion of the input signal to generate a third processed signal; and
   recombining the first processed signal, the second processed signal, and the third processed signal into an output signal.

2. The method of claim 1, further comprising:
   monitoring the output signal to detect a variation in an output characteristic of the output signal; and
   in response to detecting the variation, adjusting the gain applied to at least one of the portions of the input signal.

3. The method of claim 2, wherein:
   the step of monitoring comprises monitoring inter-symbol-interference in the output signal; and
   the step of adjusting the gain comprises determining an adjustment for the gain applied to each portion of the signal based on the inter-symbol-interference.

4. The method of claim 1, further comprising:
   measuring transmission properties for a communication medium; and
   setting the first gain, the second gain, and the third gain based on the measurements of the first communication medium.

5. The method of claim 4, wherein:
   the communication medium is a first communication medium; and
   the method further comprises:
      measuring transmission properties for a second communication medium; and
      setting the first gain, the second gain, and the third gain based on the measurements of the second communication medium.

6. The method of claim 1, further comprising:
   determining a target ratio between the second gain and the first gain such that the second gain provides a predetermined relative gain as compared to the first gain; and
   adjusting the first gain until the ratio between the second gain and the first gain reaches the target ratio.

7. The method of claim 1, further comprising conditioning the input signal using a variable gain limiting amplifier.

8. The method of claim 1, wherein:
   applying the first gain comprises controlling a first bias current applied to a first amplifier;
   applying the second gain comprises controlling a second bias current applied to a second amplifier; and
   applying the third gain comprises controlling a third bias current applied to a third amplifier.

9. The method of claim 1, further comprising:
   amplifying the output signal; and
   communicating the output signal to a next destination.

10. The method of claim 1, further comprising introducing a delay in communication of at least one of the portions of the input signal down the respective path.

11. The method of claim 1, wherein:
   the first-order mathematical operation comprises taking a derivative; and
   the second-order mathematical operation comprises taking a second derivative.

12. The method of claim 1, wherein:
   the first gain is applied by a first multi-stage amplifier;
   the second gain is applied by a second multi-stage amplifier;
   the third gain is applied by a third multi-stage amplifiers; and the method further comprises applying a correction voltage to a plurality of stages in each multi-stage amplifier to correct a DC offset imparted by the respective multi-stage amplifier.

13. An apparatus for compensating for attenuation in an input signal, comprising:
an input operable to receive an input signal;
a plurality of signal paths, comprising:
a first path operable to receive a first portion of the input signal;
a second path operable to receive a second portion of the input signal; and
a third path operable to receive a third portion of the input signal;
a first amplifier operable to apply a first gain to the first portion of the input signal to generate a first processed signal;
a second amplifier operable to apply a second gain to the second portion of the input signal;
a third amplifier operable to apply a third gain to the third portion of the input signal;
a first mathematical operator operable to apply a first-order mathematical operation to the second portion of the signal, wherein the operation of the second amplifier and the first mathematical operator on the second portion of the signal generates a second processed signal;
a second mathematical operator operable to apply a second-order mathematical operation to the third portion of the signal, wherein the operation of the third amplifier and the second mathematical operator on the third portion of the signal generates a third processed signal; and
a mixer operable to recombine the first processed signal, the second processed signal, and the third processed signal into an output signal.

14. The apparatus of claim 13, further comprising:
an output monitor operable to monitor the output signal for a variation in an output characteristic; and
an adaptive controller operable to adjust at least one of the gains in response to detecting the variation in the output characteristic of the output signal.

15. The apparatus of claim 14, wherein:
the output monitor monitors for inter-symbol interference in the output signal; and
the adaptive controller is further operable to determine which of the gains to adjust based on the inter-symbol-interference detected by the output monitor.

16. The apparatus of claim 14, wherein:
each of the amplifiers is controlled by a bias current applied to the respective amplifier; and
the adaptive controller is further operable to adjust the bias currents applied to the amplifiers.

17. The apparatus of claim 14, wherein the adaptive controller is further operable to:
determine a target ratio between the second gain and the first gain such that the second gain provides a predetermined relative gain as compared to the first gain; and
adjust the first gain until the ratio between the second gain and the first gain reaches the target ratio.

18. The apparatus of claim 13, wherein the input comprises a variable gain limiting amplifier operable to condition the input signal.

19. The apparatus of claim 13, further comprising a drive amplifier operable to:
amplify the output signal; and
communicate the output signal to a next destination.

20. The apparatus of claim 13, wherein the:
the first-order mathematical operation comprises taking a derivative; and
the second-order mathematical operation comprises taking a second derivative.

21. The apparatus of claim 13, wherein:
the first amplifier, the second amplifier, and the third amplifier are all multi-stage amplifiers; and
the apparatus further comprises an offset controller operable to apply a correction voltage to a plurality of stages in each of the amplifiers to correct a DC offset imparted by the respective amplifier.

22. An apparatus for compensating for attenuation in an input signal comprising:
a variable gain limiting amplifier operable to receive and condition an input signal and further operable to communicate a first portion, a second portion, and a third portion of the input signal using a first, second, and third signal path, respectively;
a first amplifier operable to apply a first gain to the first portion of the input signal to generate a first processed signal;
a second amplifier operable to apply a second gain to the second portion of the input signal;
a third amplifier operable to apply a third gain to the third portion of the input signal;
a first mathematical operator operable to take a derivative of the second portion, wherein the operation of the second amplifier and the first mathematical operator on the second portion of the signal generates a second processed signal;
a second mathematical operator operable to take a second derivative of the third portion, wherein the operation of the third amplifier and the second mathematical operator on the third portion of the signal generates a third processed signal;
a mixer operable to recombine the first processed signal, the second processed signal, and the third processed signal into an output signal;
an output monitor operable to monitor inter-symbol-interference in the output signal;
an adaptive controller coupled to the output monitor operable to adjust one or more of the gains in response to the inter-symbol-interference detected by the output monitor, wherein the adaptive controller controls each of the gains by adjusting a bias current applied to the respective amplifier; and
a drive amplifier operable to amplify the output signal and to communicate the output signal to a next destination.

* * * * *

UNITED STATES PATENT AND TRADEMARK OFFICE
CERTIFICATE OF CORRECTION

PATENT NO. : 7,295,605 B2  
APPLICATION NO. : 10/783170  
DATED : November 13, 2007  
INVENTOR(S) : Weixin Gai et al.

It is certified that error appears in the above-identified patent and that said Letters Patent is hereby corrected as shown below:

Column 6, Lines 29-30, after "Accordingly, path" delete "10A" and insert -- 101A --.  
Column 6, Lines 33-34, after "each path" delete "10A, 10B" and insert -- 101A, 101B --.  
Column 6, Line 47, after "more paths" delete "10A" and insert -- 101A --.  
Column 7, Line 15, after "101A," delete "10B" and insert -- 101B --.  
Column 10, Line 48, after "101B, and" delete "10C" and insert -- 101C --.

Signed and Sealed this

Thirtieth Day of December, 2008

JON W. DUDAS  
*Director of the United States Patent and Trademark Office*